United States Patent [19]

Fischer et al.

[11] 3,778,684

[45] Dec. 11, 1973

[54] SEMICONDUCTOR ELEMENT AND METHOD OF MAKING IT

[75] Inventors: Horst Fischer, Heilbronn; Eduard Justi, Braunschweig, both of Germany

[73] Assignee: Licentia Patent-Verwaltungs G.m.b.H., Frankfurt am Main, Germany

[22] Filed: Jan. 13, 1972

[21] Appl. No.: 217,597

[30] Foreign Application Priority Data

Mar. 17, 1971 Germany .................. P 21 12 812.1

[52] U.S. Cl. .. 317/234 R, 317/235 N, 317/235 VA, 317/235 AC, 317/234 M

[51] Int. Cl. .......................................... H01l 15/00

[58] Field of Search .................... 317/235 N, 234 E, 317/234 M, 237, 235 VA, 235 AC, 234

[56] References Cited

UNITED STATES PATENTS

| | | | |
|---|---|---|---|
| 3,536,965 | 10/1970 | Shurtleff | 317/234 |
| 3,523,222 | 8/1970 | Jaeger | 317/234 |
| 3,686,080 | 8/1972 | Banfield | 204/15 |
| 3,483,038 | 12/1969 | Hui | 136/89 |
| 3,492,621 | 1/1970 | Yamada | 338/19 |
| 3,496,427 | 2/1970 | Lee | 317/234 |
| 3,442,007 | 5/1969 | Griffin | 29/472.9 |
| 3,541,679 | 11/1970 | Mandelkorn | 29/572 |

*Primary Examiner*—Martin H. Edlow
*Attorney*—George H. Spencer et al.

[57] ABSTRACT

A semiconductor element comprises a semiconductor body with at least one metal electrode mounted thereon, a conducting layer consisting at least partly of palladium, rhenium or rhodium being provided between the metal electrode and the semiconductor body. A method of manufacturing such a semiconductor element is also disclosed.

9 Claims, 7 Drawing Figures

COMPARISON BETWEEN AU-AND PD-GRIDS

RE GRID REDUCED IN AN AUTOCLAVE
(8h IN HZ, 30at, 250 °C)

RE GRID AFTER 24 HOURS STORAGE IN AIR

SEMICONDUCTOR ELEMENT AND METHOD OF MAKING IT

BACKGROUND OF THE INVENTION

The invention relates to a semiconductor element and a method of making such an element. Such a semiconductor element suitably has at least one metal electrode which is attached by pressing or cementing.

In known photoelectric barrier layer cells based on semiconductors, the surface provided for receiving the incident light is usually covered with a thin wire metal mesh which is pressed or bonded on and which serves for collecting the electric current produced from light and to reduce the internal resistance of the cell by shortening the current paths, thereby increasing the current yield for a given starting voltage. In the prior art, the contact resistance between the semiconductor surface on the one hand and the metal mesh on the other was reduced by gold-plating the mesh in order to prevent the formation of oxide layers. This gold-plated mesh was placed on the semiconductor surface and covered with a foil applied by means of an adhesive. Then, the whole assembly was pressed and exposed to such an heat that the adhesive made a firm connection with the zones of the semiconductor surface exposed between the mesh-shaped electrode, and with the electrode itself.

It has been shown that the contact resistances between the metal mesh and the semiconductor body are comparatively large, in spite of the use of a metal electrode plated with gold.

SUMMARY OF THE INVENTION

It is an object of the invention to eliminate or substantially reduce the above disadvantage.

According to the invention, there is provided a semiconductor element comprising a semiconductor body, at least one metal electrode mounted on said semiconductor body and a conducting layer between said metal electrode and said semiconductor body and consisting, at least in part of one or more substances selected from the group consisting of palladium, rhenium and rhodium.

BRIEF DESCRIPTION OF THE DRAWINGS

The invention will now be described in greater detail by way of example, with reference to the accompanying drawings, in which.

DESCRIPTION OF THE PREFERRED EMBODIMENTS

The invention proposes in a semiconductor element of the kind hereinbefore described, that a conducting metal layer is arranged between the metal electrode and the semiconductor body, which layer consists at least partly of palladium, rhenium or rhodium.

The invention is also based on the surprising fact, supported by electron diffraction recordings, that gold is by no means a completely noble metal, but is covered by a single molecule layer of gold oxide with a very bad electrical conductivity. Systematic investigations have shown that only one of the noble metals has a good electrical conductivity of the oxide top layer, namely Pd. Furthermore, it has also been found that a less noble metal, such a rhenium, has, amongst its seven different oxides, low oxides which are excellent conductors so that the desired low transfer resistance can be achieved with a Cu mesh by covering the same, preferably electrolytically, with a Re layer of a few $\mu$m thickness. Combined oxygen is removed from this Re layer preferably subsequently either by cathodic reduction or by a later chemical reduction in a hydrogen atmosphere at a temperature of several hundred degrees.

By means of the method according to the invention, the transfer resistances of all semiconductor elements which are equipped with pressed on or cemented on contacts, may be substantially reduced. Thus, during tests, the power yield of a photoelement with an electrode coated with palladium could be increased by 7 percent, compared with the hitherto used elements with gold electrodes. In addition, the semiconductor elements according to the invention have stable electrical characteristics and a long useful life.

The intermediate layer according to the invention is of particular advantage in photosensitive elements, equipped on one surface, and more particularly on the surface receiving the incident light, with a metal electrode mesh applied by pressing or cementing. The pressing on or cementing on forms frequently the most economical method of contacting and is therefore preferred especially for thin-layer photocells based on junction semiconductors.

In a preferred embodiment, the metal electrode is coated on the surface facing the semiconductor body with elementary rhenium, palladium or rhodium. Then, the metal electrode is pressed against the semiconductor surface in the manner outlined above.

In a modified embodiment, the metal electrode is bonded to the surface of the semiconductor, and the adhesive, for example, an epoxy resin, is filled with rhenium, palladium or rhodium.

Figure 1:
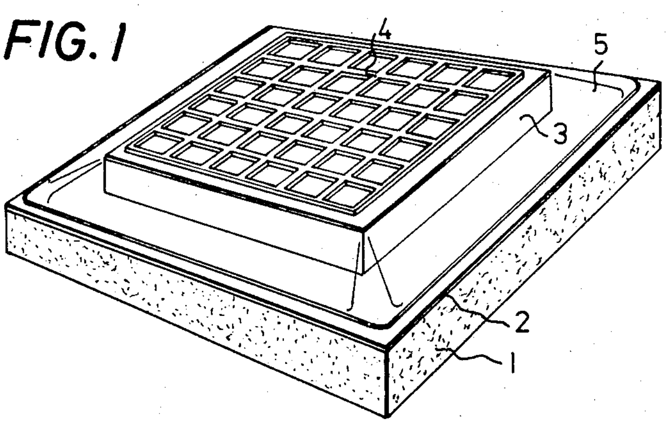
FIG. 1 shows a thin layer photocell in plan view.
Figure 2:
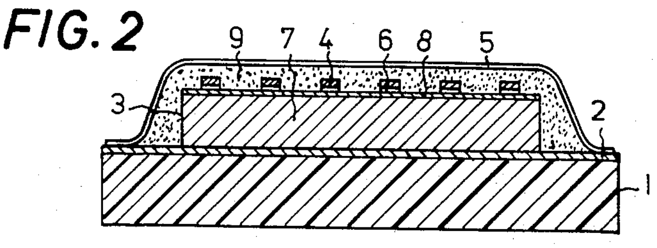
FIG. 2 shows the thin layer photocell of FIG. 1 in cross-section.

Referring now to the drawings, FIGS. 1 and 2 show one example of a thin layer photocell in accordance with the invention.

A thin layer photocell 3 is mounted on a carrier 1. The carrier 1 consists, for example, of plastic and is coated on the surface provided for the semiconductor body with silver or another metal with good conductivity (2). The semiconductor body may consist, for example, of cadmium sulphide or of cadmium telluride. For forming a barrier layer, the basic semiconductor body 7 may be provided with a thin layer 8 of $Cu_2S$.

The semiconductor body has a thickness in the order of 30 $\mu$m.

The thin surface layer 8 of the semiconductor body which is exposed during the operation of the semiconductor element to the incident light, carries a grid or mesh-shaped metal electrode 4. The bars of the grid may have a thickness in the order of 10 $\mu$m, whilst the space between the bars is about 50 $\mu$m. In this manner, about 90 percent of the surface of the semiconductor remains uncovered by the metal electrode so that almost the whole incident light may be utilized for producing electrical energy.

The grid-shaped metal electrode consists, for example, of gold, copper, or gold-plated copper. At least the surface of the metal grid facing the semiconductor is coated with rhenium or with palladium (6). The thickness of this layer is in the order of a few $\mu$m. Rhenium or palladium may be applied to the metal electrode by evaporation or precipitated by electrolysis.

In one embodiment, the metal grid 4 is placed on the semiconductor surface. Then, a transparent foil 5 coated with a transparent adhesive 9 is placed on the semiconductor arrangement and pressed on. Preferably, the pressing is effected at a temperature, at which the adhesive becomes plastic so that after cooling and setting of the adhesive, the semiconductor, the metal electrode and the foil are intimately connected.

Preferably, the transparent covering foil 5 is bonded along its edge to the surface of the carrier 1, so that the thin layer photocell 3 is protected completely against external influences.

In another preferred embodiment, the grid-shaped metal electrode 4, consisting of gold, copper or gold-plated copper, is bonded to the surface of the semiconductor with an adhesive filled with rhenium or palladium. Then, as already described, the semiconductor arrangement is covered with the foil 5.

The graphs in FIGS. 3 to 7 show the current-voltage load curves of cadmium telluride thin layer cells which are contacted with different grid-shaped metal electrodes.

Figure 3:
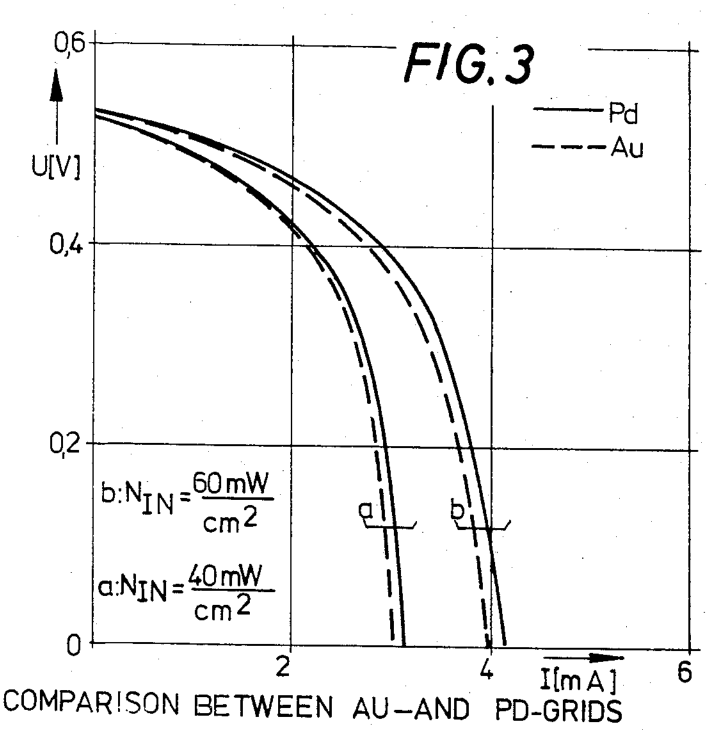
FIG. 3 is a graph showing current-voltage load curves of cadmium telluride thin layer cells, showing a comparison between cells using known electrodes and cells in accordance with the invention.

The current-voltage load curves in FIG. 3 are valid for different values of the input radiation. The curves *a* apply to an input of $N_{ein} \approx 40$ mW/cm$^2$, whilst the curves *b* were recorded for an input of $N_{ein} = 60$ mW/cm$^2$. The solid curves were obtained with cells with palladium coated metal electrodes, and the dotted lines show the curves for grid electrodes with gold plating. As may be seen from the difference between the dotted line curves and the solid curves, photocells with palladium coated grids provide higher currents at the same voltage, corresponding to a substantially higher power yield.

Figure 4:
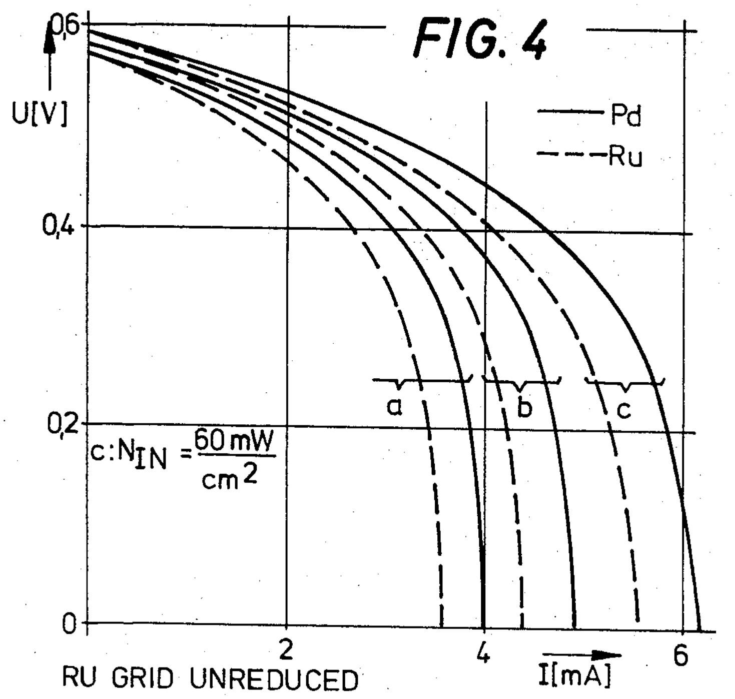
FIG. 4 is a graph similar to FIG. 3 but showing a comparison between cells having electrodes coated with palladium and ruthenium.

The current-voltage diagram of FIG. 4 is a comparison between cells with Pd coated grids and cells with grids coated with ruthenium. Also here it can be seen that the power yield of cells with Pd grids is substantially higher than that of cells with Ru grids, and that also here cells with Pd coated grids should be preferred.

Figure 5:
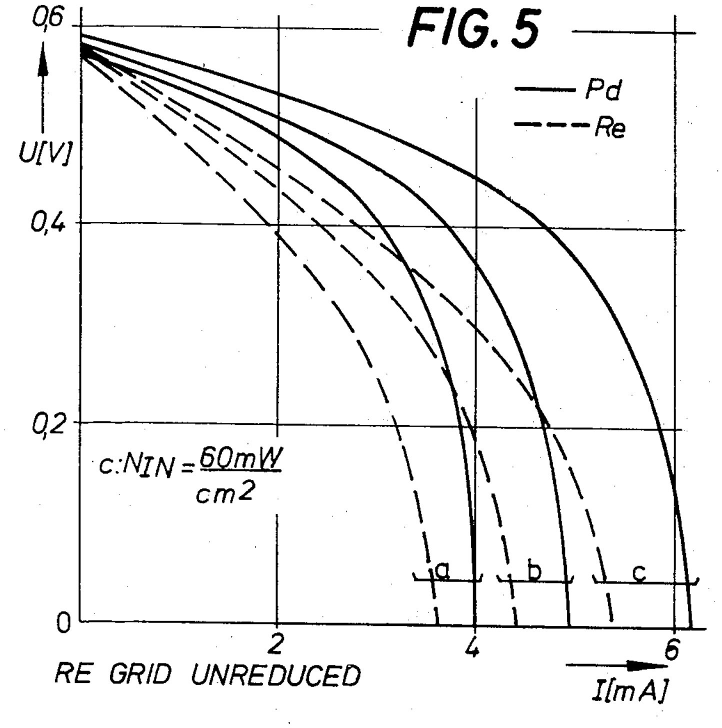
FIG. 5 is a graph similar to FIG. 3 but showing a comparison between electrodes coated with palladium and unreduced rhenium.

The curves *a*, *b*, and *c*, in FIG. 5 were recorded with different input radiations. Palladium coated grids are here compared with rhenium coated grids. As may be seen from the curves, the power yield of cells with Pd grids is substantially larger than that of cells with Re grids. This is due to the fact that an unreduced Re grid has been used which was obviously covered with a higher, comparatively badly conducting oxide.

Figure 6:
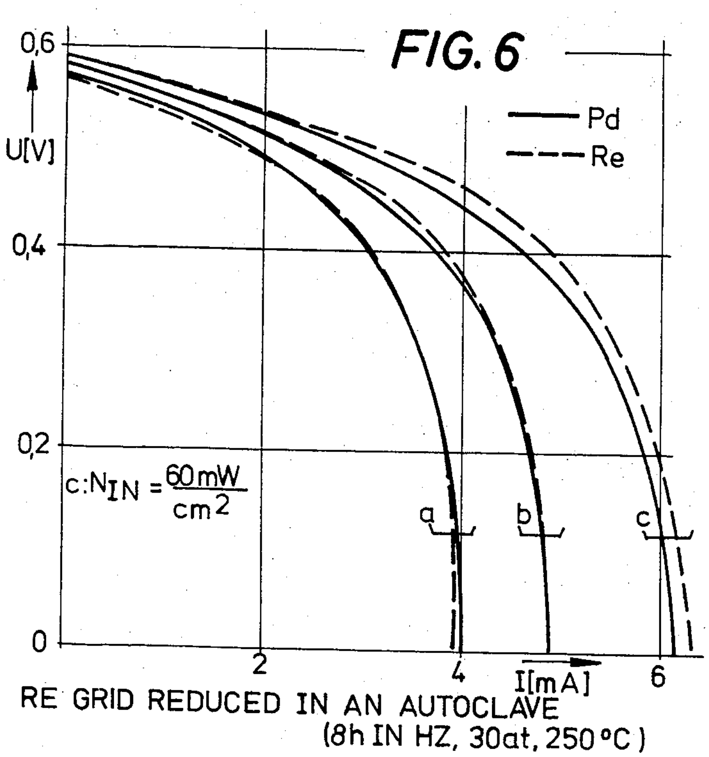
FIG. 6 is a graph similar to FIG. 5 but showing a comparison between electrodes coated with palladium and reduced rhenium.

It results from the current voltage diagram in FIG. 6 that reduction of the Re grid substantially improves the power yield of cells with Re grids which may be raised to or even above the value of cells with Pd grids. The cells with rhenium coated grids were reduced in an autoclave for 8 hours in an hydrogen atmosphere, at a pressure of 30 kg/cm$^2$ and a temperature of 250°C.

Figure 7:
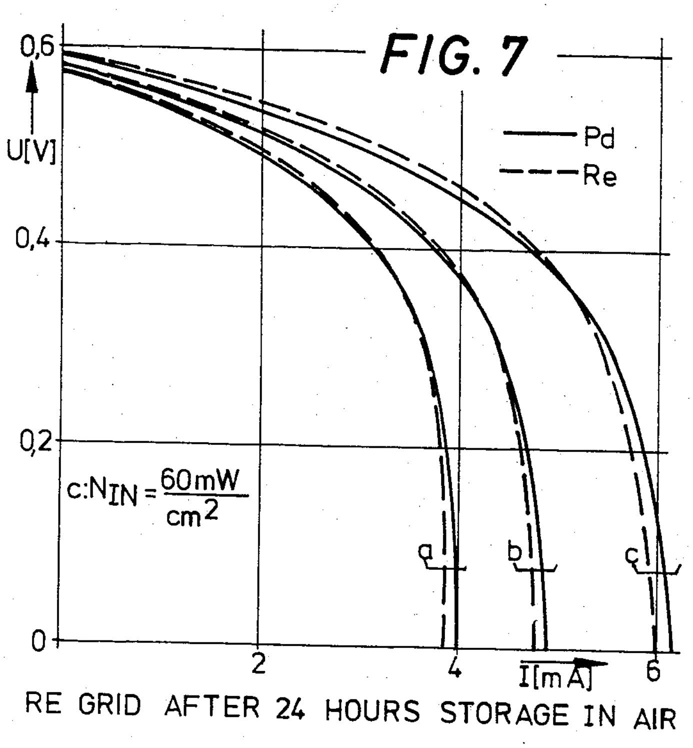
FIG. 7 is a graph similar to FIG. 6 but showing a comparison between electrodes coated with palladium and reduced rhenium after the cells have been stored in air for 24 hours.

As may be seen from FIG. 7, the cells with reduced Re grids maintained their good properties substantially even after 24 hours storage in air.

It will be understood that the above description of the present invention is susceptible to various modification changes and adaptations.

What is claimed is:

1. A thin film photovoltaic cell comprising a body of semiconductor material wherein said material is CdS or CdTe; a thin semiconductor layer of $Cu_2S$ on a surface of said semiconductor body and forming a barrier therewith; a current collecting and conducting metal grid overlying the exposed surface of said thin semiconductor layer; and a conducting layer, including a metal selected from the group consisting of Pd, Rh, and Re, between and in contact with the surface of said thin semiconductor layer and said grid.

2. A photovoltaic cell as defined in claim 1 wherein said conducting layer is a metal coating on at least the portion of the metal grid facing said surface of said thin semiconductor layer.

3. A photovoltaic cell as defined in claim 1 including means for pressing the said grid and conducting layer against said thin semiconductor layer.

4. A photovoltaic cell as defined in claim 1 wherein said conducting layer is an adhesive containing said metal from the group consisting of Pd, Rh and Re.

5. A photovoltaic cell as defined in claim 3 wherein said means for pressing comprises a transparent coating overlying said metal grid and the regions of the surface of said thin semiconductor layer exposed in the grid spaces of said metal grid, said coating adhering to said exposed regions of said thin semiconductor layer and maintaining said semiconductor layer, said conductive layer and said grid in intimate contact.

6. A photovoltaic cell as defined in claim 1 further comprising a base on which said semiconductor body is mounted, and a transparent film covering said semiconductor body and said grid and adhesively affixed to said base for sealing said semiconductor body and grid against external influences.

7. A photovoltaic cell as defined in claim 4, wherein said adhesive comprises an epoxy resin.

8. A photovoltaic cell as defined in claim 1 wherein said semiconductor body material comprises cadmium sulphide.

9. A photovoltaic cell as defined in claim 1 wherein said semiconductor body material comprises cadmium telluride.

* * * * *